(12) United States Patent
Ju

(10) Patent No.: US 7,214,071 B1
(45) Date of Patent: May 8, 2007

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/372,014

(22) Filed: Mar. 10, 2006

(51) Int. Cl.
*H01R 12/00* (2006.01)

(52) U.S. Cl. ........................................ 439/71

(58) Field of Classification Search ............. 439/71, 439/70, 72, 73, 677, 311
See application file for complete search history.

(56) References Cited

U.S. PATENT DOCUMENTS

| | | | | |
|---|---|---|---|---|
| 4,647,124 A | * | 3/1987 | Kandybowski | 439/71 |
| 4,699,593 A | * | 10/1987 | Grabbe et al. | 439/71 |
| 6,178,629 B1 | * | 1/2001 | Rathburn | 29/843 |
| 6,203,332 B1 | * | 3/2001 | Tashiro et al. | 439/71 |
| 6,796,805 B2 | * | 9/2004 | Murr | 439/71 |
| 6,948,946 B1 | * | 9/2005 | Ju | 439/71 |
| 2004/0266246 A1 | * | 12/2004 | Hashimoto | 439/331 |

* cited by examiner

*Primary Examiner*—Alexander Gilman
(74) *Attorney, Agent, or Firm*—Rosenberg, Klein & Lee

(57) ABSTRACT

An electrical connector includes an insulating body and conducting pins. The insulating body includes a base body and side walls. The side walls form a receiving space for receiving electronic elements. There are a plurality of pin-receiving holes on the base body disposed via an inclined method. The conducting pins are received in the pin-receiving holes. At one side that is opposite to the inclined pin-receiving holes, there is an inclined side wall. Furthermore, at the side that is opposite to the inclined pin-receiving holes, there is a positioning element used for positioning the rim of the received electronic element. Because there are inclined pin-receiving holes on the insulating body and there is an inclined side wall located opposite to inclined pin-receiving holes, it is easy to take out the mold when the insulating body is being molded. It also assures the mass of the insulating body.

18 Claims, 2 Drawing Sheets

ELECTRICAL CONNECTOR

BACKGROUND OF THE INVENTION

1. Field of the Invention

The present invention relates to an electrical connector.

2. Description of the Related Art

A land grid array electrical connector is generally used in the electronic field for electrically connecting the chip mold to a circuit board. An electrical connector generally includes an insulating body and conducting pins received in the insulating body. In the prior art, the insulating body includes a body, and there are a plurality of pin-receiving holes that are disposed in the body in parallel. The conducting pins are arranged and received in the pin-receiving holes of the insulating body via an inclined method. There are four side walls in the rim of the body and the four side walls are vertical to body. However, the above structure has a drawback. Because the four side walls are vertical to body, there is no space to take out the mold when the insulating body is molding. It is inconvenient for molding the insulating body.

SUMMARY OF THE INVENTION

One particular aspect of the present invention is to provide an electrical connector that is easily produced.

The electrical connector of the present invention includes an insulating body and conducting pins. The insulating body includes a base body and side walls located at the rim of the base body. The side walls form a receiving space for receiving electronic elements. There are a plurality of pin-receiving holes on the base body and they are disposed via an inclined method. The conducting pins are received in the pin-receiving holes. At one side that is opposite to the pin-receiving holes, there is an inclined side wall. Furthermore, at one side that is opposite to the inclined pin-receiving holes, there is a positioning element that is used for positioning the rim of the received electronic element.

The present invention has the following merit: because there are inclined pin-receiving holes on the insulating body and there is an inclined side wall located in the side that is opposite to the inclined pin-receiving holes, it is easy to take out the mold when the insulating body is being molded. It also assures the mass of the insulating body.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

The detailed illustration of the electric connector of the present invention is described below.

Figure 1:
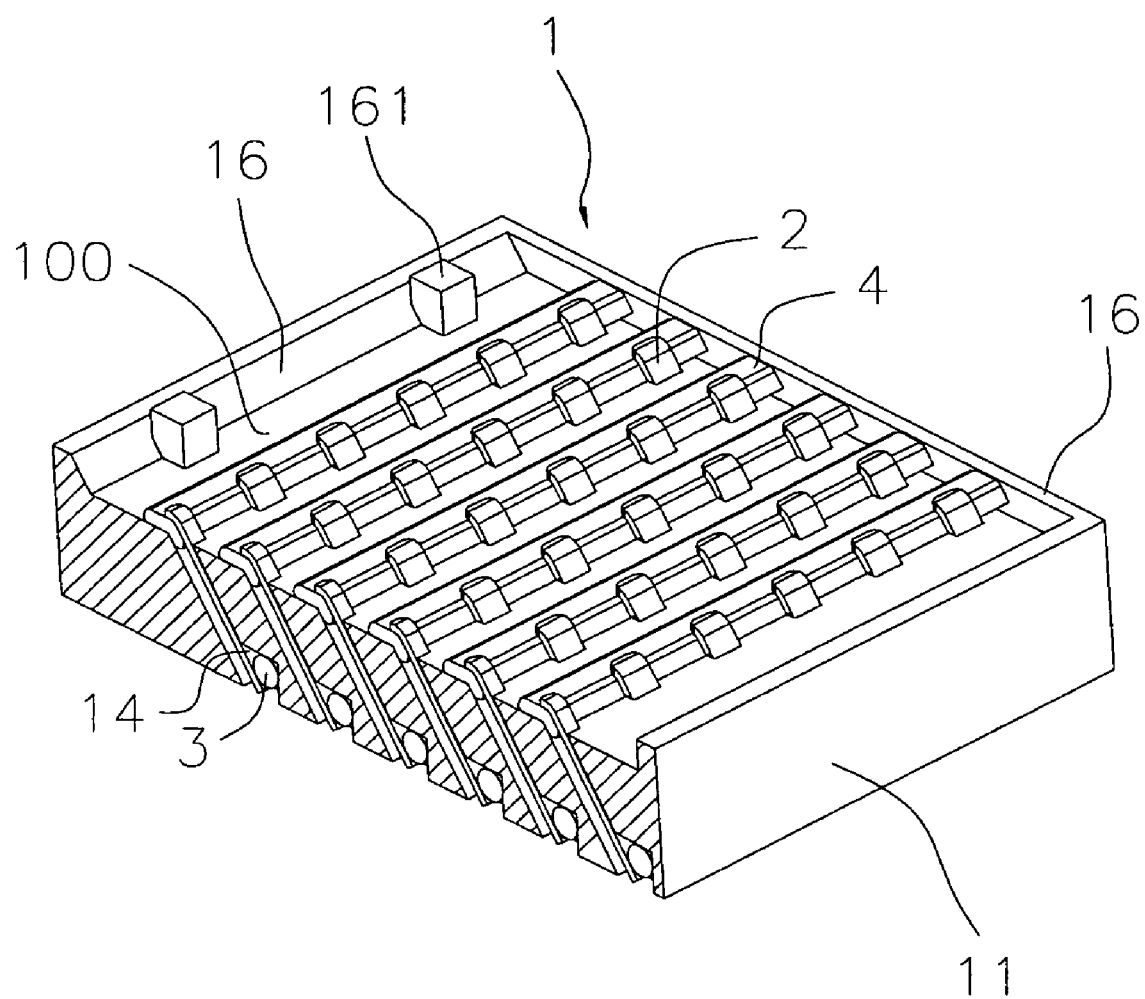
FIG. 1 is a perspective view of the electric connector of the present invention.
Figure 2:
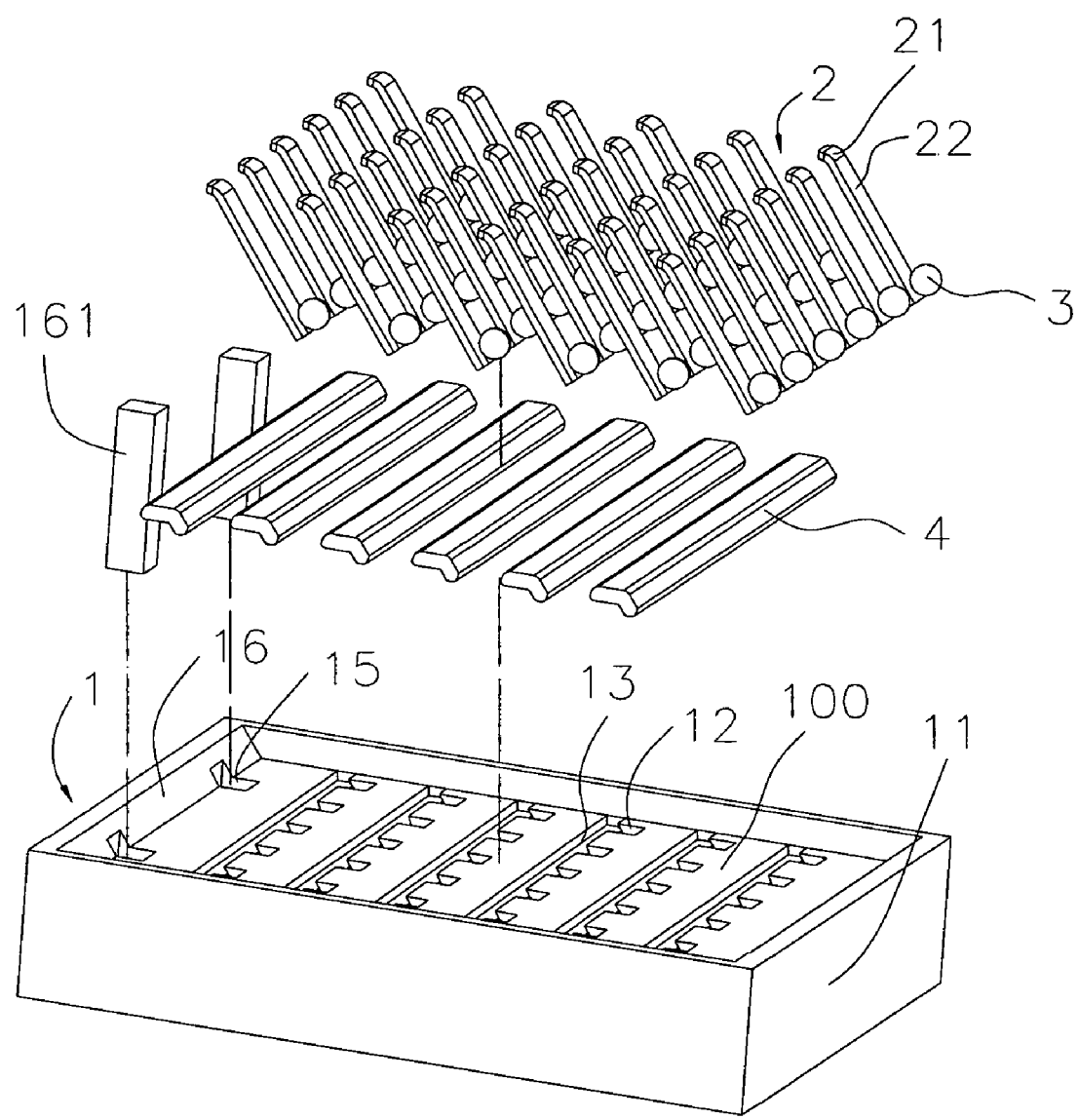
FIG. 2 is an exploded perspective view of the electric connector of the present invention.

Please refer to FIG. 1 and FIG. 2. The electric connector of the present invention includes an insulating body 1 and conducting pins 2 received in the insulating body 1.

The insulating body 1 includes a base body 11. At the rim of the base body 11, there are four side walls 16 that have two pairs of side walls 16 opposite to each other. The four side walls 16 form a receiving space 100 for receiving a chip mold (not shown in the figure). In the insulating body 1, there are a plurality of pin-receiving holes 12 that are disposed via an inclined method and pass through the base body 11. The conducting pins 2 are received in the pin-receiving holes 12. On the surface of the insulating body 1, there are receiving slots 13 that are linked with the pin-receiving holes 12. At the lower side of the pin-receiving holes 12, there are solder ball receiving holes 14 for receiving the solder balls 14. At one side that is opposite to inclined pin-receiving holes 12, there is an inclined side wall 16. The included angle between an inclined side wall 15 and the upper surface of the insulating body 1 is less than or equal to the included angle between the pin-receiving holes 12 and the upper surface of the insulating body 1. Therefore, the mold is easily taken out when the mold of the insulating body 1 is being produced. It also assures the mass of the insulating body 1. There are two positioning holes 15 located at the intersection area of the base body 11 of the insulating body 1 and the inclined side wall 16. A positioning element 161 is received in the positioning hole 15. One end of the positioning element 161 that is near to the receiving space 100 is a plane that is vertical to the upper surface of the insulating body 1. As shown in FIG. 2, the upper end of the positioning element 161 is a plane. The upper end of the positioning element 161 can be a curve or any other shape. The shape of the upper end of the positioning element 161 does not need to be restricted as is shown in FIG. 2, it is allowable if the one end of the positioning element 161 near to the receiving space 100 is a plane. Thereby, the positioning element 161 can fasten the rim of the chip mold (not shown in the figure) received in the receiving space 100 to fix the chip mold to the insulating body 1.

The conducting pin 2 includes a flexible arm 21 that protrudes from the upper surface of the insulating body 1, and a connecting part 22 that extends from the flexible arm 21. The chip mold (not shown in the figure) is received in the receiving space 100 of the insulating body 1 via the conducing pins 2. The chip mold is electrically connected with the pins 2 via the flexible arm 21 of the pins 2. Under the flexible arm 21, there is a flexible rubber body 4 that supports the flexible arm 21. The flexible rubber body 4 has a bar shape and is received in the receiving slot 13 of the insulating body 1. On side of the flexible rubber body 4 leans against the connecting part 22 of the conducting pin 2. When the chip mold is pressed against the flexible arm 21 of the conducting pin 2, the flexible rubber body 4 prevents the flexible arm 21 from being deformed permanently. At the end of the conducting pin 2, a solder ball 3 is soldered. The solder ball 3 is received in the solder ball receiving hole 14 of the insulating body 1. In order to simplify the manufacturing process, the opening of the solder ball receiving hole 14 is smaller than the receiving space of the solder ball 3. Therefore, the solder ball 3 does not need to be soldered in the solder ball receiving hole 14 of the insulating body 1. The solder ball 3 is pressed directly into the solder ball receiving hole 14. There is a gap between the solder ball 3 and the wall of the solder ball receiving hole 14 so that the solder ball 3 can be moved upward and downward in the solder ball receiving hole 14.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electrical connector, comprising:
an insulating body having a base body and side walls forming a rim on the base body, the side walls defining a receiving space for receiving electronic elements, one of the side walls being an inclined side wall having an inclined surface extending from the rim on the base body into the receiving space and terminated at an upper surface of the base body, the base body having formed therein a plurality of inclined pin-receiving holes, where the included angle between the inclined side wall and the upper surface of the base body is less than or equal to the included angle between the pin-receiving holes and the upper surface of the insulating body, at least one positioning hole being formed at the intersection area where the inclined side wall terminates at the base body;
conducting pins received in the pin-receiving holes; and
a positioning element for positioning a rim of the received electronic element, the positioning element being received in the positioning hole.

2. The electrical connector as claimed in claim 1, wherein one end of the positioning element that is near to the receiving space is a plane that is vertical to the upper surface of the insulating body.

3. The electrical connector as claimed in claim 1, wherein the conducting pin includes a flexible arm protruding from the upper surface of the insulating body, and there is a flexible rubber body used for supporting the flexible arm and located under the flexible arm.

4. The electrical connector as claimed in claim 3, wherein there are receiving slots located on the surface of the insulating body and linked with the pin-receiving holes, and the flexible rubber body is received in the receiving slot.

5. The electrical connector as claimed in claim 3, wherein the flexible rubber body is bar-shaped.

6. The electrical connector as claimed in claim 1, wherein there is a solder ball receiving hole located under the pin-receiving hole, and a solder ball is received therein.

7. The electrical connector as claimed in claim 6, wherein a receiving space is formed between the end of the conducting pin and the solder ball receiving hole, and the opening of the receiving space is smaller than the solder ball.

8. The electrical connector as claimed in claim 7, wherein there is a gap between the solder ball and the wall of the solder ball receiving hole that allows the solder ball to be moved upward and downward in the solder ball receiving hole.

9. An electrical connector, comprising:
an insulating body having a base body and side walls forming a rim around the base body, the side walls defining a receiving space for receiving electronic elements, one of the side walls being an inclined side wall having an inclined surface extending from the rim on the base body into the receiving space and terminated at an upper surface of the base body, the base body having formed therein a plurality of inclined pin-receiving holes;
conducting pins received in the pin-receiving holes; and
a positioning element for positioning a rim of the received electronic element, the positioning element being positioned at an intersection area where the inclined side wall terminates at the base body.

10. The electrical connector as claimed in claim 9, wherein one end of the positioning element that is near to the receiving space is a plane that is vertical to the upper surface of the insulating body.

11. The electrical connector as claimed in claim 9, wherein the included angle between the inclined side wall and the upper surface of the base body is less than or equal to the included angle between the pin-receiving holes and the upper surface of the base body.

12. The electrical connector as claimed in claim 11, wherein at least one positioning hole is located at the intersection area where the inclined side wall terminates at the base body, the positioning element being received in the positioning hole.

13. The electrical connector as claimed in claim 9, wherein the conducting pin includes a flexible arm protruding from the upper surface of the insulating body, and there is a flexible rubber body used for supporting the flexible arm and located under the flexible arm.

14. The electrical connector as claimed in claim 13, wherein there are receiving slots located on the surface of the insulating body and linked with the pin-receiving holes, and the flexible rubber body is received in the receiving slot.

15. The electrical connector as claimed in claim 13, wherein the flexible rubber body is bar-shaped.

16. The electrical connector as claimed in claim 9, wherein there is a solder ball receiving hole located under the pin-receiving hole, and a solder ball is received therein.

17. The electrical connector as claimed in claim 16, wherein a receiving space is formed between the end of the conducting pin and the solder ball receiving hole, and the opening of the receiving space is smaller than the solder ball.

18. The electrical connector as claimed in claim 17, wherein there is a gap between the solder ball and the wall of the solder ball receiving hole that allows the solder ball to be moved upward and downward in the solder ball receiving hole.

* * * * *